United States Patent
Ritchey et al.

(10) Patent No.: US 8,422,978 B2
(45) Date of Patent: Apr. 16, 2013

(54) BROADBAND TUNER FOR VERY WIDE SIGNAL CONVERSION

(75) Inventors: Carey Ritchey, Murphy, TX (US); Kim E. Beumer, Richardson, TX (US); Marius Pop, Richardson, TX (US)

(73) Assignee: CSR Technology Inc., Sunnyvale, CA (US)

(*) Notice: Subject to any disclaimer, the term of this patent is extended or adjusted under 35 U.S.C. 154(b) by 0 days.

(21) Appl. No.: 13/339,560

(22) Filed: Dec. 29, 2011

(65) Prior Publication Data

US 2012/0099686 A1    Apr. 26, 2012

Related U.S. Application Data

(62) Division of application No. 12/101,649, filed on Apr. 11, 2008, now Pat. No. 8,107,918.

(51) Int. Cl.
*H04B 1/26* (2006.01)
(52) U.S. Cl.
USPC ............................. 455/323; 455/308; 455/339
(58) Field of Classification Search .................. 455/207, 455/209, 230, 266, 314, 313, 323
See application file for complete search history.

(56) References Cited

U.S. PATENT DOCUMENTS

| | | | |
|---|---|---|---|
| 4,902,960 A | 2/1990 | Lowenstein et al. | |
| 6,175,591 B1 | 1/2001 | Iwamatsu | |
| 7,035,614 B2 | 4/2006 | Dessert et al. | |
| 7,164,899 B2 | 1/2007 | Davis | |
| 7,184,724 B1 | 2/2007 | Ashby et al. | |
| 2002/0075875 A1 | 6/2002 | Dravida et al. | |
| 2003/0067359 A1* | 4/2003 | Darabi et al. | 331/46 |
| 2003/0128084 A1 | 7/2003 | Chang et al. | |
| 2005/0040909 A1 | 2/2005 | Waight et al. | |
| 2006/0078069 A1 | 4/2006 | Seendripu et al. | |
| 2006/0116088 A1 | 6/2006 | Block et al. | |
| 2007/0007598 A1 | 1/2007 | Woo et al. | |

OTHER PUBLICATIONS

International Search Report and Written Opinion issued for PCT/US2009/033670, dated Apr. 14, 2009, 9 pages.

* cited by examiner

*Primary Examiner* — Christian Hannon
(74) *Attorney, Agent, or Firm* — Fulbright & Jaworski L.L.P.

(57) ABSTRACT

An agile RF tuner circuit capable of converting a wide portion of RF signal into an IF signal suitable for analog-to-digital conversion. The circuit up converts a received RF signal to a high IF signal and then down converts the high IF signal to a low IF signal. Embodiments of the RF circuit incorporate harmonic reject mixers to suppress harmonics and intermodulations typically associated with the frequency conversion process.

14 Claims, 3 Drawing Sheets

BROADBAND TUNER FOR VERY WIDE SIGNAL CONVERSION

CROSS-REFERENCE TO RELATED APPLICATIONS

The present application is a division of U.S. patent application Ser. No. 12/101,649 entitled "BROADBAND TUNER FOR VERY WIDE SIGNAL CONVERSION," filed Apr. 11, 2008, now U.S. Pat. No. 8,107,918 and is related to concurrently filed and commonly assigned U.S. patent application Ser. No. 13/339,549 entitled "BROADBAND TUNER FOR VERY WIDE SIGNAL CONVERSION," the disclosures of which are incorporated herein by reference.

TECHNICAL FIELD

The present invention generally relates to Radio Frequency (RF) tuners. More specifically, the present invention relates to an agile RF tuner that converts a relatively wide portion of an incoming RF signal from a broadband signal to an Intermediate Frequency (IF) signal.

BACKGROUND OF THE INVENTION

RF tuners are involved in several different communications applications including mobile phone communications and analog and digital TV reception. Tuners are often used to convert a portion of a received RF broadband signal into an IF output signal, which, for example, may later be digitized or processed to baseband. Generally, RF tuners are considered to be either "fixed frequency" or "agile." Conventional fixed frequency tuners are generally able to utilize a relatively wide bandwidth portion of an incoming RF signal. For instance, known fixed frequency tuners are capable of utilizing approximately one percent of a received RF broadband signal. However, fixed frequency tuners are often undesirable in several applications because they effectively receive only a single, fixed frequency band. As such, fixed frequency tuners are unable to utilize frequency spectrum outside of a predetermined band.

Agile RF tuners are often desirable because they can be tuned to effectively receive virtually any input spectrum. However, conventional agile RF tuners are limited because they are able to process only a relatively small portion of an incoming RF signal. For instance, conventional agile RF tuners are capable of receiving an input between 50 MHz and 860 MHz; but, these tuners are only able to convert approximately 6 MHz to 8 MHz of that input spectrum to an IF output signal. As such, conventional agile RF tuners utilize approximately 0.6% to 1% of input bandwidth. This, of course, leaves much to be desired in several common applications.

In view of limitations associated with known RF tuners, a need exists for an agile RF tuner that is able to convert a wide portion of received RF signals into an IF signal. As will be discussed in greater detail, embodiments of the present invention satisfy such a need.

BRIEF SUMMARY OF THE INVENTION

In accordance with embodiments of the present invention, disadvantages and problems associated with prior RF tuners have been substantially reduced or eliminated. According to particular embodiments, an agile RF tuner has a frequency conversion architecture that converts wide portions (e.g., ten percent or more) of a received RF broadband spectrum to an IF output signal. According to certain embodiments, the IF signal is utilized in a number of applications, including television and mobile phone reception. For example, embodiments used in television reception applications can be tuned to receive between 50 MHz and 1.1 GHz of RF spectrum and convert approximately 100 MHz or more of that spectrum to an IF signal. To that end, a preferred embodiment utilizes a bandpass filter implemented as a switched filter having an analog trim and a plurality of filters configured to provide a minimum number of spurious product bands in the desired IF signal. Embodiments thus provide a desired IF signal that is substantially free of spurious emission (i.e., spurious emissions are sufficiently low in energy level and/or order so as not to impair the performance of the desired signal). Slope adjustment circuitry maintains flat spectral power of the IF signal thereby improving tuner utility. A lowpass and bandpass filter output are supported by the tuner, this allows further supression of harmonics and improves tuner output.

As mentioned, embodiments of the present invention are thought to be particularly useful in several applications, including wide-band reception of data or digital video signals for cable networks. Embodiments of the present invention can be used in reception systems to allow those systems to effectively utilize multiple channels. For example, U.S.-based systems could simultaneously receive up to 16 data carriers for both data content and video streams. Accordingly, embodiments of the invention can be used in a DOCSIS cable modem or in multiple video streams for personal video recorder (PVR) type functions.

In practice, cable providers often change the transmission frequency of its programming; as such, there is no guarantee as to where the carriers a user wishes to receive will be located. Accordingly, particular embodiments provide an RF tuner that can be incorporated into a variety of cable plans and freely adapted to effectively utilize a wide range of carrier signals.

Other embodiments provide a front end for applications such as software-defined radio and the like. These embodiments allow broadband digital systems to examine broad portions of received spectrum and determine what portions of that spectrum need to be demodulated. Additional embodiments provide frequency agile movement between signals where one band of signals can be converted up or down to another band of signals. These features are particularly useful in, for example, on-channel processor or signal processor applications.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
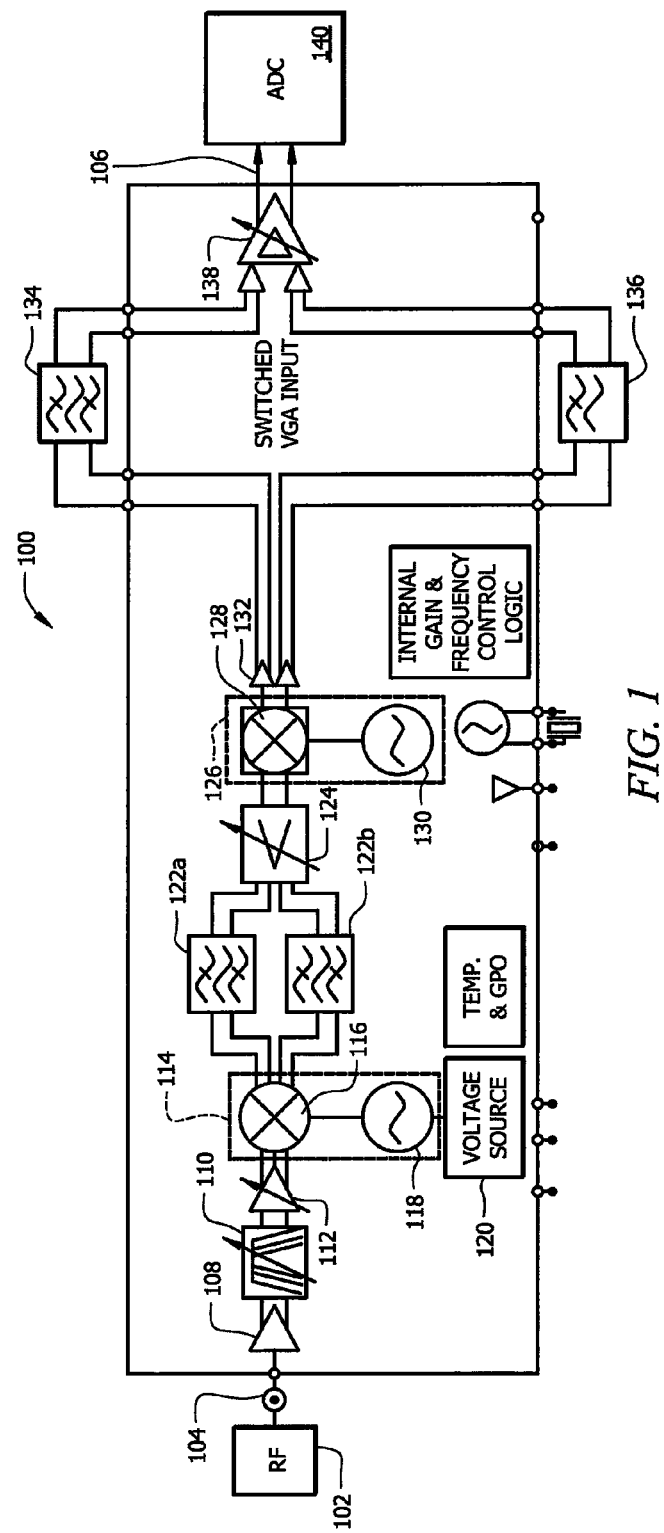
FIG. 1 depicts one embodiment of an RF tuner circuit according to the present invention.

FIG. 1 illustrates an exemplary embodiment of a tuner circuit 100 for frequency agile conversion of a relatively wide frequency range of a Radio Frequency (RF) broadband signal into an Intermediate Frequency (IF) signal. The architecture of circuit 100 provides for an RF tuner that is both agile and able to convert a relatively wide portion (e.g., 10 percent or more) of an incoming RF broadband signal into an IF signal. Moreover, the circuitry of the preferred embodiment is configured to utilize integrated components such that a synergistic cascade of component attributes provides an output signal having a desired signal quality, such as a signal quality meeting video transmission head end requirements. Embodiments of tuner circuit 100 can be implemented in a number of RF tuner applications, not the least of which includes digital television and high speed data reception.

According to the embodiment shown in FIG. 1, RF signal 102 enters circuit 100 at input 104. RF tuner signal 102 comprises signals representing channels that are assigned to specific frequencies in a defined frequency band. For example, in the context of a television reception system, RF signal 102 comprises a radio frequency signal in the band between about 50 MHz to about 1,100 MHz having a plurality of approximately 6 to 8 MHz channels therein. As will be discussed in greater detail, RF signal 102 undergoes an up-conversion to a first Intermediate Frequency (IF) and a down-conversion to yield a second IF signal, which is output as output signal 106.

According to the embodiment shown in FIG. 1, RF signal 102 is communicated to amplifier 108. Amplifier 108 is provided to amplify input signal 102 to a desired level prior to frequency translation; that is, amplifier 108 preferably acts as an input buffer and/or provides a portion of the total system gain. Although not illustrated in detail, according to some implementations of the present invention, amplifier 108 may be a variable gain amplifier which is operable to maintain the input to band pass filter 110 at a constant magnitude. Alternative embodiments of the present invention may omit amplifier 108 and/or utilize other components to provide desired signal conditioning attributes, such as a filter or attenuator element.

The signal output from amplifier 108 is provided to bandpass filter 110. Filter 110 of the preferred embodiment is a band pass filter having a center frequency corresponding to the signal frequency of signal 102. To minimize tuner dimensions, filter 110 may be implemented on the same substrate as the circuitry of tuner 100 without compromising a desired level of signal quality. However, this filter may also be provided externally to the common substrate utilized for circuit elements of tuner 100. It should be appreciated that advantages are still realized in such an alternative embodiment utilizing an external filter as the selectivity requirements of filter 110 remain relaxed (or the filter may be absent in embodiments), and thus the complexity and/or cost, of this filter is reduced.

According to the illustrated embodiment, band pass filter 110 allows continuous tuning of the bandwidth that passes there through and is preferably implemented in switched mode while having a analog trim. Accordingly, band pass filter 110 is able to track different frequency spectrums, which is desirable for operation over a wide frequency range with high immunity to noise and interference. Also, the analog trim feature of band pass filter 110 allows for refined adjustment of band pass filter 110. The combination of switch and trim features of bandpass filter 110 provide an advantage in view of commonly implemented filters. For example, bandpass filters implemented strictly as switched filters lack utility during continuous operation because signals of interest all too often fall between the range of two adjacent switched filters and are thereby lost. As a result, the signal cannot be completely utilized. Also, bandpass filters that are implemented strictly in analog mode operate over a limited bandwidth, perhaps less than one octave. In such filters a varactor diode or a variable capacitor is used to pull or push a filter across a given bandwidth. Such filters are not satisfactory for desired applications that require coverage over many octaves (e.g., 50 MHz to 1,100 MHz).

As the desired bandwidth of RF signal 102 increases over an octave of frequencies (where an octave is defined as the low end frequency times two to the high end), the number of intermodulation products and the possibility of cross modulation products increases very fast, imposing greater demands upon tuner 100. Therefore, when more than one octave of RF signal 102 is to be covered by tuner 100, bandpass filter 110 advantageously employs band switching techniques to accommodate the entire desired frequency band. Band pass filter 110, being preferably implemented with a switched filter structure having an analog trim, is advantageous insomuch as the trim feature allows band pass filter 110 to be tuned to frequencies that would otherwise fall between the ranges of adjacent filters.

Band pass filter 110 communicates the filtered RF signal to RF Gain Control module 112, which is operable to limit the composite signal power before RF signal 102 reaches up-conversion stage 114. In the architecture depicted in FIG. 1, up-conversion stage 114 frequency translates RF signal 102 using a combination of up-conversion mixer 116 and high side local oscillator (LO) 118. Up-conversion mixer 116 is provided to convert signal 102 to a high intermediate frequency (HIF) utilizing LO 118. As shown, LO 118 may be a variable oscillator in order to provide selection of a desired output channel of a frequency division set of channels. In using an integrated circuit to implement the preferred embodiment of the present invention, double balanced mixers having very good carrier suppression can be implemented relatively easily.

According to the embodiment shown in FIG. 1, the signal of high side LO 118 is placed above RF signal 102 to facilitate an operation known as high side injection. This operation is beneficial because it allows for the placement of local oscillators and their associated harmonics to fall out of the band of interest, thereby avoiding the generation of interference in the converted output signal.

As mentioned, up-conversion mixer 116 is driven by the signal of high side LO 118, which is above RF signal 102. Again, this operation is known as high side injection. According to particular embodiments, high side LO 118 can be a voltage controlled oscillator (VCO) where a control voltage dictates the output frequency of LO 118. As seen in FIG. 1, the control voltage is supplied by voltage source 120, which, according to the illustrated embodiment may be used to provide a signal for controlling other on-chip components of tuner circuit 100. Several different circuitry techniques can be used to build high side LO 118. In order to tune and stabilize the control voltage of high side LO 118, a phase lock loop (PLL) can be used to lock the control voltage to a reference frequency, or multiples thereof, which is provided by, for example, a crystal oscillator. It should be appreciated that LO 118 is illustrated as a variable oscillator, such as may be implemented in the form of a voltage controlled oscillator. Mixer 116 may be controlled to translate an input signal at $f_{HIF}$ to any of a plurality of output signal frequencies, such as may correspond to particular defined channel frequencies. Additionally or alternatively, LO 118 may be controlled so as to provide a frequency hopping scheme suitable for deterring useful interception of a transmitted signal and/or for use in multiplexing a signal or plurality of signals, such as in time division bursts, on various output frequencies.

Switched High IF filters 122a and 122b are coupled to the output of up-conversion stage 114. Switched high IF filters 122a and 122b impart unique benefits to circuit 100. For example, the use of more than one filter, and the specific filter frequencies of each filter, allow dynamic realignment of the RF tuner. Therefore, the "cleanest" possible spectrum can be found. This ensures that the down-converted output contains minimal harmonics or inner-modulations of both input frequencies and local oscillator or local oscillator harmonics. The embodiment shown in FIG. 1 depicts the use of two filters, 122a and 122b. However, other useful embodiments are envisioned where additional filters are used, and their filter frequencies chosen, to further facilitate dynamic realignment of the tuner. According to the embodiment shown in FIG. 1, filters 122a and 122b are switched filters, and each may be active or passive.

Figure 3:
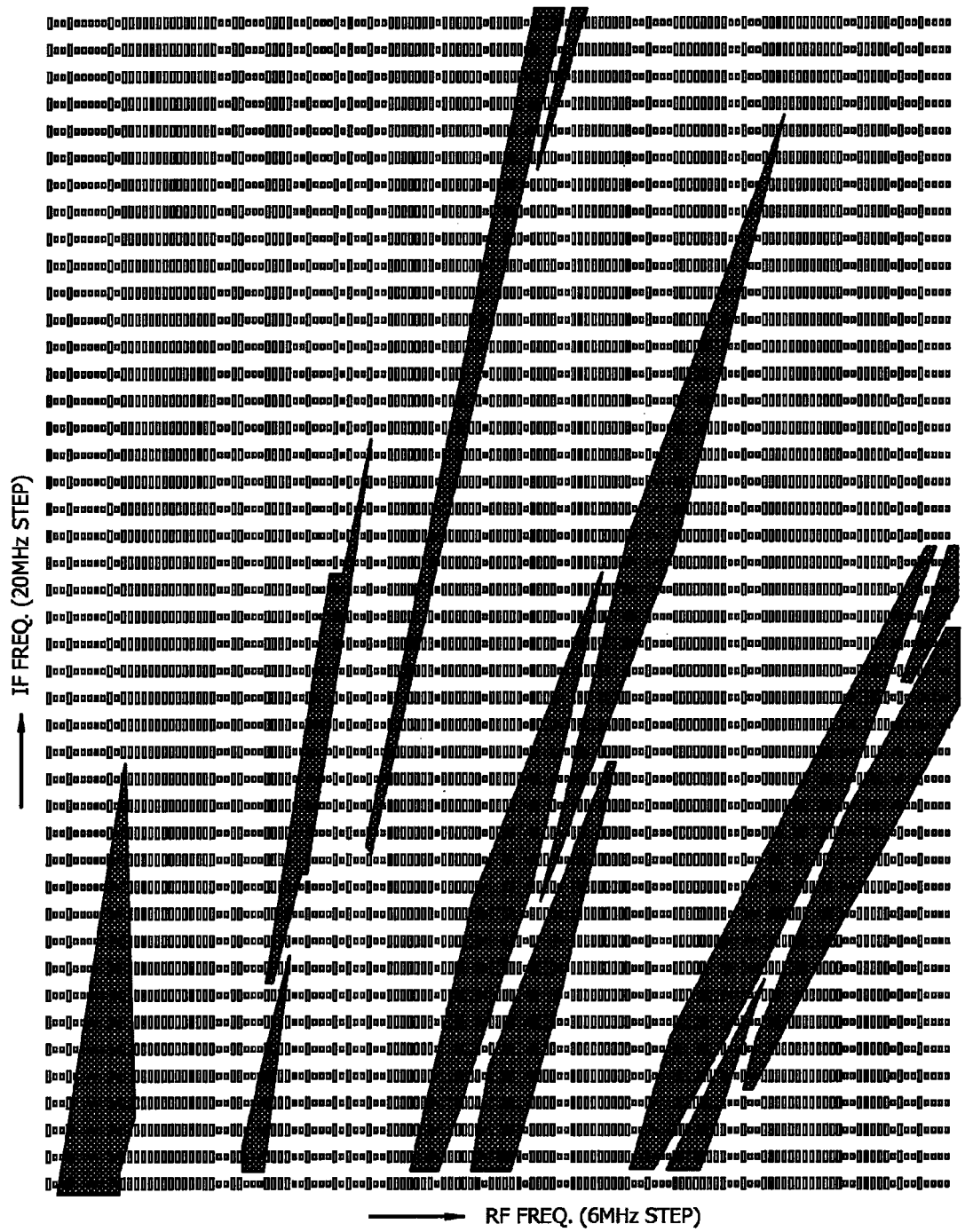
FIG. 3 depicts an IF/RF index according to embodiments of the present invention.

Typically, frequency translating an RF signal to a low IF becomes very difficult as the bandwidth of that incoming RF signal increases. That is, as the signal bandwidth increases, the likelihood of obtaining a very low IF having a minimum occurrence of spurious emission decreases. Accordingly, embodiments of the present invention employ multiple IF filters, e.g., 122a and 122b, to find the high side or low side of the desired IF signal. This features allows the best IF, i.e., that having the lowest order of spurious emission, to be chosen based upon the tuner frequency. With reference to FIG. 3, this is achieved by compiling an index of the spurious products as a function of the RF and IF signals. Using such an index, a threshold value can be determined for an IF signal, where signals associated with a value higher than the determined threshold will, theoretically, have a higher score and will not have spurious emission in the desired bandwidth.

Referring now to FIG. 3, switched high IF filters 122a and 122b operate to solve the problem associated with finding the lowest possible IF containing a minimum number of spurious product bands. FIG. 3 provides a graph where the RF frequency of signal 102 provided to mixer 116 is represented along the x axis and the IF frequency coming from mixer 116 is provided along the y axis. According to FIG. 3, RF frequency increases from left to right and IF increases from bottom to top. Spurious products bands are represented by the shaded regions in the graph. As seen, the occurrence of spurious frequency bands increases along the region comprising lower IF frequencies. As such, there is motivation to arrange filters 122a and 122b to be responsive to higher IF frequencies, as those IF frequencies tend to have lower occurrences of spurious band products. However, as the IF frequency increases, each filter's passband around the center frequency becomes wider. As the filter's passband becomes wider, the attenuation of bands adjacent to the center frequency becomes increasingly less. As such, there is a competing motivation to arrange filters 122a and 122b to be responsive to lower IF frequencies, as doing so increases the attenuation of undesirable signals. Therefore, according to preferred embodiments, filters 122a and 122b are configured to pass those signals comprising the lowest possible IF frequency having a minimum number of spurious product bands. As seen in FIG. 3, such an IF frequency is represented by the lowest IF having one spurious band, i.e., approximately 4 lines from the top of the graph. It should be appreciated that the obtainable minimum number of spurious product bands will vary according to specific circuitry configurations.

According to the embodiment shown in FIG. 1, filter 122a is used for a first frequency range within the IF signal, and filter 122b is used for a second frequency range within the IF signal. Filters 122a and 122b can be switched or tunable; however, a switched filter structure is often preferred to optimize the filter shape. Although tunable filters can be implemented, they will generally provide a non-optimal solution. The bandwidth of each filter will be relatively precise, where the center frequency of each is variable. As a result, a constant Q bandwidth of each filter can be maintained. Also, as a practical matter, variation in the center frequencies of each filter is compensated for by the agility provided by both of the up-converting and down-converting local oscillators.

Slope adjustment circuit 124 is coupled to the outputs of filters 122a and 122b and communicates the up-converted IF signal to down-conversion stage 126. Slope adjustment circuit 124 is advantageous inasmuch as it eliminates problems associated with known tuners. In practice, tuner systems are plagued with a "slope," or loss, in the spectral power of the IF signal. For example, in cable network applications, across any 100 MHz of bandwidth there will be tilt, or spectral variation, of 3 db or more. Notably, one half of a bit is lost in the digital domain for every 3 db change in power. It can be easily seen that losing even one bit is very important when digitizing the resulting IF signal.

Accordingly, slope adjustment circuit 124 advantageously "flattens" the up-converted IF signal's power level in the spectral domain. As such, the signal's power level remains constant as it is subsequently communicated to other components. As applied to the preferred embodiments of tuner 100, slope adjustment circuit 124 is particularly advantageous as it improves the utility of analog-to-digital converter 140. Slope adjustment circuit 124 flattens, or equalizes the power of the signal before it is digitized. This is in contrast to known systems, where a signal is first digitized and then equalized. Known analog-to-digital converters do not have "extra bits" available when dealing with very wide IF signals. As such, equalizing the power in the digital domain results in a loss of dynamic range. The use of slope adjustment circuit 124 effectively eliminates this problem by avoiding the case where the digital circuit loses dynamic range to capture any slope which may be present in the IF signal being digitized.

According to one embodiment, slope adjustment circuit 124 equalizes the analog signal using a feedback signal from a demodulator. The demodulator samples the signal and detects any slope across the spectrum that it is sampling. This sampling/detection can be accomplished by using a Fast Fourier Transform (FFT) or another suitable algorithm known in the art. The detected slope, quantified as an error signal, is fed back to the tuner. The tuner then makes a positive tilt or negative tilt adjustment to flatten the spectral power of the signal.

The output of slope adjustment circuitry 124 is coupled to down-conversion stage 126. According to the embodiment shown in FIG. 1, down-conversion stage 126 comprises a combination of down-conversion mixer 128 and low side local oscillator 130. Down-conversion mixer 128 frequency translates the processed RF signal to a lower Intermediate Frequency (LIF) by multiplying the processed signal with the signal of low side Local Oscillator (LO) 130. In this case, the signal of LO 130 is lower than the incoming signal. As discussed above, this is known as a switched low side injection operation. According to the embodiment shown in FIG. 1, down-conversion mixer 128 is an image rejection mixer, which is preferred as it reduces the number of spurious emission in the LIF output signal. Mixer 128 may be controlled to translate an input signal at $f_{LIF}$ to any of a plurality of output signal frequencies, such as may correspond to particular defined channel frequencies. Additionally or alternatively, LO 130 may be controlled so as to provide a frequency hopping scheme suitable for deterring useful interception of a transmitted signal and/or for use in multiplexing a signal or plurality of signals, such as in time division bursts, on various output frequencies.

According to the embodiment shown in FIG. 1, low side LO 130 comprises a suitable combination of components to generate a signal. In general, low side LO 130 is a voltage controlled oscillator (VCO) where a control voltage dictates the output frequency of low side LO 130. Several different circuitry techniques can be used to build low side LO 130. In order to tune and stabilize the control voltage of low side LO 130, a phase lock loop (PLL) can be used to lock the control voltage to a reference frequency, or multiples thereof, which is provided by, for example, a crystal oscillator. Of course, other devices will be readily apparent to those skilled in the art.

132 switches the output of down-conversion stage 126. Switching circuit 132 can be implemented using a suitable arrangement of digital and analog switching techniques. According to the embodiment shown in FIG. 1, switching circuit 132 is on the same substrate as other tuner components. However, other configurations will be apparent to those skilled in the art. In the embodiment depicted in FIG. 1, switching circuit 132 communicates the signals received from down-conversion stage 126 to bandpass filter 134 and lowpass filter 136.

Tuner 100 advantageously supports either a filtered output from bandpass filter 134 or filtered output from lowpass filter 136. In the preferred embodiment of FIG. 1, lowpass filter 136 is a 22-126 MHz LC filter, and serves as an anti-alias filter for the input of analog-to-digital converter (ADC) 140. According to the illustrated embodiment, ADC 140 operates at a clock speed of twice the rate of the highest frequency being sampled, i.e., about 300 MHz. Further, ADC 140 can be thought of as a mixer as it produces harmonics itself. Accordingly, lowpass filter 136 is implemented to sufficiently attenuate signals falling above the 126 MHz band thereby suppressing harmonics created by ADC 140 itself. In effect, lowpass filter 136 serves to improve the utility of ADC 140 by attenuating harmonics associated with the ADC 140 input signal.

According to the embodiment illustrated in FIG. 1, bandpass filter 134 is a 43.75 MHz SAW filter. Having a band pass filtered output allows other locations of the sampling clock to be at rates which are less than twice the rate of the highest frequencies being sampled. This is commonly referred to as a sub sample. According to the illustrated embodiment, the PC board on which the RF tuner circuitry is implemented will have its own clock signal, e.g., 20 MHz. As a practical matter, the tuner circuitry is hindered where the 20 MHz clock signal from the PC board locks into the IF signal path. As a result, to improve the utility of ADC 140, band pass filter 134 serves to attenuate the clock signal associated with the PC board, thereby effectively improving the range of ADC 140.

The output of bandpass filter 134 or lowpass 136 filter is communicated to variable gain amplifier (VGA) 138, which serves to control the gain of the IF signal. VGA 138 is controlled by analog-to-digital converter 140 and serves to optimize the signal swing or peak-to-peak voltage going into A/D converter 140.

Figure 2:
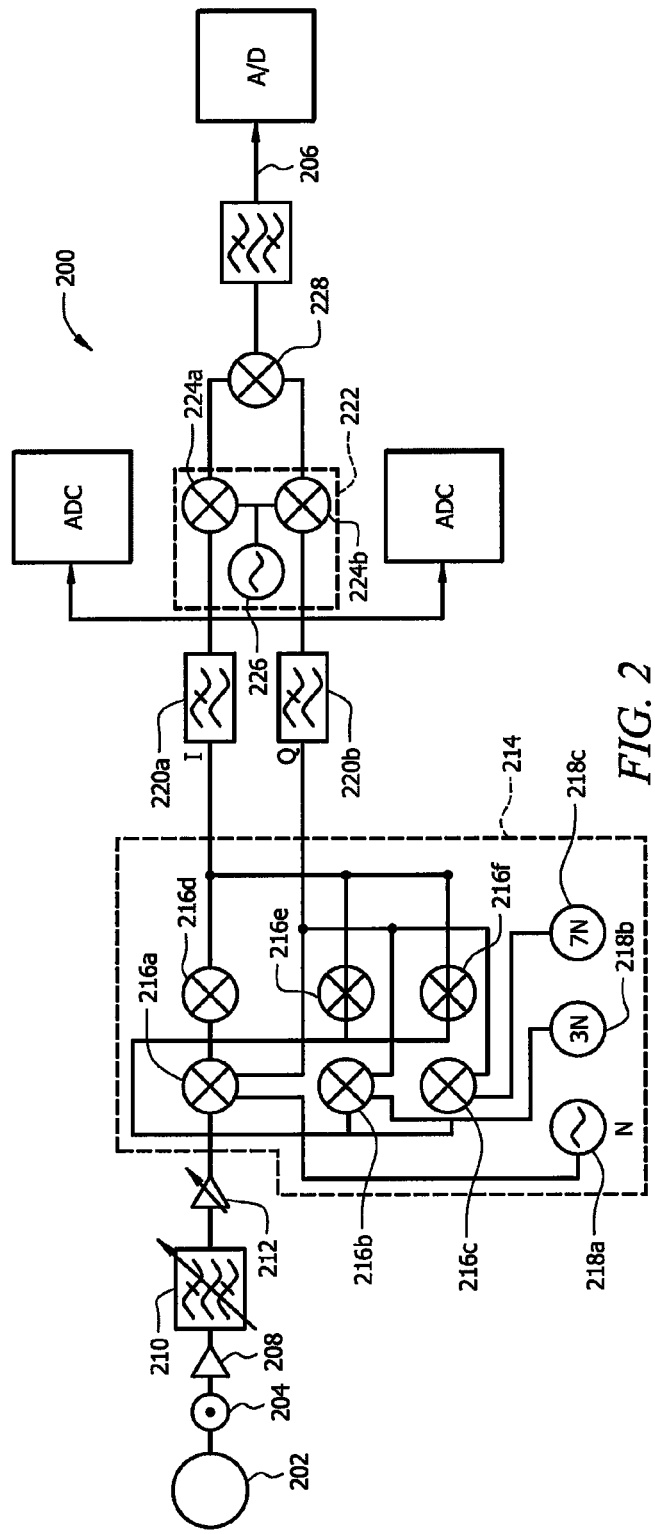
FIG. 2 depicts another embodiment of an RF tuner circuit according to the present invention.

FIG. 2 illustrates another exemplary embodiment of a tuner circuit 200 for converting a relatively wide Radio Frequency (RF) broadband signal into an Intermediate Frequency (IF) signal. The architecture of circuit 200 provides for an RF tuner that is both agile and able to convert a relatively wide portion (e.g., 10 percent or more) of an incoming RF broadband signal into an IF signal. As discussed above, tuner circuit 200 can be implemented in a number of RF tuner applications, not the least of which includes digital television and high speed data reception.

According to the embodiment shown in FIG. 2, RF signal 202 is communicated to amplifier 208. Amplifier 208 is provided to amplify input signal 202 to a desired level prior to frequency translation; that is, amplifier 208 preferably acts as an input buffer and/or provides a portion of the total system gain. Although not illustrated in detail, according to some implementation of the present invention, amplifier 208 may be a variable gain amplifier which is operable to maintain the input to band pass filter 210 at a constant magnitude. Alternative embodiments of the present invention may omit amplifier 208 and/or utilize other components to provide desired signal conditioning attributes, such as a filter or attenuator element.

The signal output from amplifier 208 is provided to bandpass filter 210. Filter 210 of the preferred embodiment is a band pass filter having a center frequency corresponding to the signal frequency of signal 202. To minimize tuner dimensions, filter 210 may be implemented on the same substrate as the circuitry of tuner 200 without compromising a desired level of signal quality. However, this filter may also be provided externally to the common substrate utilized for circuit elements of tuner 200. It should be appreciated that advantages are still realized in such an alternative embodiment utilizing an external filter as the selectivity requirements of filter 210 remain relaxed (or the filter may be absent in embodiments), and thus the complexity and/or cost, of this filter is reduced.

According to the illustrated embodiment, band pass filter 210 allows continuous tuning of the bandwidth that passes there through and is preferably implemented in switched mode while having a analog trim. Accordingly, band pass filter 210 is able to track different frequency spectrums, which is desirable for operation over a wide frequency range with high immunity to noise and interference. Also, the analog trim feature of band pass filter 210 allows for refined adjustment of band pass filter 210. The combination of switch and trim features of bandpass filter 210 provide an advantage in view of commonly implemented filters. For example, bandpass filters implemented strictly as switched filters lack utility during continuous operation because signals of interest all too often fall between the range of two adjacent switched filters and are thereby lost. As a result, the signal cannot be completely utilized. Also, bandpass filters that are implemented strictly in analog mode operate over a limited bandwidth, perhaps less than one octave. In such filters a varactor diode or a variable capacitor is used to pull or push a filter across a given bandwidth. Such filters are not satisfactory for desired applications that require coverage over many octaves (e.g., 50 MHz to 2,100 MHz).

As the desired bandwidth of RF signal 202 increases over an octave of frequencies (where an octave is defined as the low end frequency times two to the high end), the number of intermodulation products and the possibility of cross modulation products increases very fast, imposing greater demands upon tuner 200. Therefore, when more than one octave of RF signal 202 is to be covered by tuner 200, bandpass filter 210 advantageously employs band switching techniques to accommodate the entire desired frequency band. Band pass filter 210, being preferably implemented with a switched filter structure having an analog trim, is advantageous insomuch as the trim feature allows band pass filter 210 to be tuned to frequencies that would otherwise fall between the ranges of adjacent filters.

Band pass filter 210 communicates the filtered RF signal to RF Gain Control module 212, which is operable to limit the composite signal power before RF signal 202 reaches up-conversion stage 214. In the architecture shown in FIG. 2, down-conversion stage 214 comprises a combination of harmonic reject mixers, designated as 216a-216f, and a series of harmonic oscillators, designated as 218a-218c. Down-conversion stage 214 operates to down convert RF signal 202 to an IF baseband having real and complex components. As discussed above, RF signal 202 will comprise a relatively wide baseband RF signal. As such, without taking appropriate action, the harmonics associated with mixers 216a-216f would fall within the signal spectrum. Therefore, down-conversion stage 214 operates to effectively reject the harmonics associated with mixer 216a-216f from the resulting IF signal. As will be discussed in greater detail, down-conversion stage 214 is followed by two lowpass filters, 220a and 220b, which are each responsible for filtering one-half (i.e., the positive and negative components) of the first IF signal.

According to the embodiment shown in FIG. 2, down-conversion stage 214 includes a series of local oscillators, 216a-216f, that are related frequency-wise by frequency multiplication or division. Generally, undesirable harmonics can be suppressed by employing various combinations of such mixers and their associated local oscillator signals. A method of suppressing harmonics by employing various mixers is described in U.S. Pat. No. 7,164,899, the disclosure of which is herein incorporated by reference. Harmonic reject mixers 216a-216c comprise a first mixer stage and harmonic rejection mixers 216d-216f comprise a second mixer stage. While the embodiment shown in FIG. 2 employs six mixers, useful embodiments of circuit 200 are not confined to having six harmonic reject mixers. Other useful embodiments will be apparent to those skilled in the art.

Harmonic oscillators 218a-218c supply signals to harmonic mixers 216a-216f. Oscillator 218a is driven by N number of phases, oscillator 218b is driven by 3N phases, and oscillator 218c is driven by 7N phases. The signals of the first mixer stage (i.e., 218a-218c used to generate the Q part of the first IF signal) are shifted and/or inverted with respect to the signals of the second mixer stage (i.e., 218d-218f used to generate the I part of the first IF signal). That is, the signals applied to harmonic reject mixers 216a-216c are phase shifted by 90 degrees with respect to the signals applied to harmonic reject mixers 216d-216f. Having a relative phase difference of 90 degrees between signals of reject mixers 216a-216c and 216d-216f allows for I-Q frequency translation. In combination, harmonic reject mixers 216a-216f operate on the first IF signal to separate the quadrature baseband component, designated by Q, from its in-phase baseband component, designated by I.

After leaving down-conversion stage 214, the first IF signal is communicated to lowpass filters 220a and 220b. Lowpass filters 220a and 220b are operable to perform a modified version of what is otherwise known in the art as the Weaver method. That is, lowpass filters 220a and 220b provide a bandpass response using complex signals. Lowpass filters 220a and 220b each have differential signals comprising a first IF signal band. The first IF signal has both positive and negative frequencies, so each band is only half as wide as the original signal band. As shown, lowpass filter 220a operates to filter the in-phase component, I, of the first IF signal and filter 220b operates to filter the quadrature component, Q, of the first IF signal.

As mentioned, the embodiment shown in FIG. 2 represents a modified version of the Weaver method. That is, the classical Weaver method involves mixer architecture that has local oscillators fed to both the down-converting and up-converting mixers to effectively form an down/up converter with complex filtering in the inner stage. However, the classical Weaver method does not contain any elements of harmonic rejection. Instead, the classical Weaver method assumes that the input signal is free from any spectrum that could potentially contain mixer harmonics. As a practical matter, such an assumption often proves to be faulty. The embodiment shown in FIG. 2, eliminates the need to rely upon such an assumption by effectively rejecting any harmonics associated with mixers 116a-116f at down-conversion stage 114.

The in-phase and quadrature components of the first IF signal are communicated from lowpass filters 220a and 220b to up-conversion stage 222. Up-conversion stage 222 includes a combination of quadrature mixers 224a and 224b. Mixers 224a and 224b frequency translate the imaginary and real components of the first IF signal to a higher, centered second IF signal. This "re-mixing" is accomplished by multiplying in-phase and quadrature components of the first IF signal with the signal of high side Local Oscillator (LO) 226. In this case, the signal of high side LO 226 is above the in-phase and quadrature components of the first IF signal. Up-conversion mixer 226 comprises suitable circuitry that multiplies the IF signals with a local signal to generate a second IF signal.

By utilizing the phase differences described above, the signal components may be provided to mixers 224a and 224b in such a way as to result in constructive combining of desired signals and destructive combining of undesired signal images. Specifically, when the outputs of mixers 224a and 224b are summed by summer 228, the desired signal components are in-phase and constructively combine while the undesired images are out of phase and destructively combine. For example, according to the preferred embodiment of FIG. 2, assuming the input signal is at a frequency of $f_{LIF}$, the desired signal components $f_{LO1}+f_{LIF}$ from each mixers 224a and 224b are in-phase and combine to enhance the amplitude of the resulting HIF signal while the undesired signal image components $f_{LO1}-f_{LIF}$ from mixers 224a and 224b are 180° out of phase and combine to substantially null the image signals. Accordingly, as only the desired signal is output and the undesired signal images at the other sideband are suppressed, summer 228 form a single sideband (SSB) or image reject mixer.

The re-combined second IF signal of the illustrated embodiment is sampled by an analog-to-digital converter. Alternative embodiments of the present invention may, however, omit the foregoing combining of the in-phase and quadrature components. For example, analog-to-digital converters may be provided at the output of lowpass filters 220a and 220b according to embodiments of the invention. According to such embodiments, mixers (such as mixers 224a and 224b) may be used to frequency shift the in-phase and quadrature components to a second IF signal (e.g., without combining provided by combiner 228) prior to providing the signal components to analog-to-digital converters.

Although the present invention and its advantages have been described in detail, it should be understood that various changes, substitutions and alterations can be made herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method for converting a wide portion of a received RF signal into an IF signal, said method comprising:
    processing said RF signal in continuous fashion;
    frequency translating said processed RF signal to a low IF signal, said low IF signal comprising an in-phase component and a quadrature component, wherein frequency translating said processed RF signal to a low IF signal is accomplished, at least in part, by mixing said RF signal with a plurality of harmonic reject mixers;
    lowpass filtering the in-phase and quadrature components of said low IF signal;
    frequency translating each of said low pass filtered in-phase and low pass filtered quadrature components of said low IF signal to a high IF signal having in-phase and quadrature components; and
    converting said high IF in-phase and quadrature components to a digital signal.

2. The method of claim 1 wherein said processing said RF signal comprises bandpass filtering said RF signal with a filter comprising a switched filter structure with analog trim.

3. The method of claim 1 wherein said harmonic reject mixers operate on said RF signal to suppress harmonics associated with said harmonic reject mixers.

4. The method of claim 3 wherein said plurality of harmonic reject mixers comprises a first mixer stage and a second mixer stage.

5. The method of claim 4 wherein said first mixer stage generates said in-phase components of said low IF signal.

6. The method of claim 5 wherein said second mixer stage generates said quadrature component of said low IF signal.

7. The method of claim 4 wherein said first and second mixer stages each comprise a plurality of mixers, the signals of the first stage mixers being offset from the signals of the second stage mixers by ninety degrees.

8. A circuit for converting a wide portion of a received RF signal into an IF signal, said circuit comprising:
    a bandpass filter comprising a switched filter structure with analog trim;
    a down conversion stage operable to frequency translate said filtered RF signal to a low IF signal, said low IF signal comprising an in-phase component and a quadrature component;
    a first lowpass filter for filtering the in-phase component of said low IF signal;
    a second lowpass filter for filtering the quadrature component of said low IF signal; and
    at least one analog-to-digital converter, said at least one analog-to-digital converter operable to convert said in-phase and quadrature components into digital signals.

9. The circuit of claim 8 wherein said bandpass filter is operable to filter said RF signal prior to said down conversion stage.

10. The circuit of claim 8 wherein said down-conversion stage comprises a plurality of harmonic reject mixers.

11. The circuit of claim 10 wherein the signals of said harmonic reject mixers operate on said RF signal to suppress harmonics associated with said harmonic reject mixers.

12. The circuit of claim 10 wherein said plurality of harmonic reject mixers comprises a parallel mixers.

13. The circuit of claim 12 wherein a first mixer of said parallel mixers generates said in-phase components of said IF signal.

14. The circuit of claim 13 wherein said second mixer of said parallel mixers generates said quadrature component of said IF signal.

* * * * *